US011375629B2

(12) United States Patent
Crowley et al.

(10) Patent No.: US 11,375,629 B2
(45) Date of Patent: Jun. 28, 2022

(54) ROTATING FRAME LOCK FOR FRONT CRYSTAL RETENTION AND SEALING

(71) Applicant: Apple Inc., Cupertino, CA (US)

(72) Inventors: Patrick J. Crowley, San Jose, CA (US); Maegan K. Spencer, La Honda, CA (US)

(73) Assignee: Apple Inc., Cupertino, CA (US)

( * ) Notice: Subject to any disclaimer, the term of this patent is extended or adjusted under 35 U.S.C. 154(b) by 221 days.

(21) Appl. No.: 16/795,011

(22) Filed: Feb. 19, 2020

(65) Prior Publication Data

US 2021/0100117 A1    Apr. 1, 2021

Related U.S. Application Data

(60) Provisional application No. 62/906,550, filed on Sep. 26, 2019.

(51) Int. Cl.
| | | |
|---|---|---|
| *H05K 5/02* | (2006.01) | |
| *H05K 5/06* | (2006.01) | |
| *H01L 23/10* | (2006.01) | |

(52) U.S. Cl.
CPC .......... *H05K 5/0221* (2013.01); *H01L 23/10* (2013.01); *H05K 5/0208* (2013.01); *H05K 5/061* (2013.01)

(58) Field of Classification Search
None
See application file for complete search history.

(56) References Cited

U.S. PATENT DOCUMENTS

| | | | | |
|---|---|---|---|---|
| 5,613,237 A * | 3/1997 | Bent | ...................... | H04B 1/086 |
| | | | | 220/4.02 |
| 7,525,535 B2 * | 4/2009 | Kim | ...................... | G06F 1/1656 |
| | | | | 345/169 |
| 7,677,578 B2 * | 3/2010 | Taguchi | .................. | F16J 15/14 |
| | | | | 277/592 |
| 7,854,434 B2 * | 12/2010 | Heiman | ................. | F16J 15/121 |
| | | | | 277/644 |
| 8,112,129 B2 * | 2/2012 | Shinoda | ................. | H05K 5/069 |
| | | | | 455/575.1 |
| 8,129,632 B2 * | 3/2012 | Shinoda | ................. | H04M 1/18 |
| | | | | 174/554 |
| 8,575,499 B2 * | 11/2013 | Hayashi | ................. | H05K 5/069 |
| | | | | 174/564 |

(Continued)

FOREIGN PATENT DOCUMENTS

| | | |
|---|---|---|
| CN | 102822575 | 12/2012 |
| CN | 103687394 | 3/2014 |

(Continued)

OTHER PUBLICATIONS

Chinese Patent Application No. 202010960819.8, Office Action, dated Sep. 3, 2021, 8 pages.

*Primary Examiner* — Xanthia C Cunningham
(74) *Attorney, Agent, or Firm* — Kilpatrick Townsend & Stockton LLP (57) ABSTRACT

A housing for an electronic device is disclosed. The housing includes housing components and a connector. The connector can be positioned between adjacent edges of two housing components. The connector can rotate from a first position to a second position to form a sealed joint between two adjacent housing components. The sealed joint can prevent moisture and debris from entering the housing of the electronic device.

20 Claims, 6 Drawing Sheets

(56) References Cited

U.S. PATENT DOCUMENTS

| | | | |
|---|---|---|---|
| 8,738,104 B2* | 5/2014 | Yeates | H05K 7/02 455/575.8 |
| 8,830,662 B2* | 9/2014 | Myers | H05K 5/0213 361/679.01 |
| 9,143,179 B2* | 9/2015 | Hikino | H01Q 9/16 |
| 9,326,403 B2* | 4/2016 | Xie | G06F 1/1656 |
| 9,338,908 B2* | 5/2016 | Tan | H04M 1/0254 |
| 9,788,093 B2* | 10/2017 | Ozcan | H04R 1/06 |
| 9,791,893 B2* | 10/2017 | Yamaguchi | G06F 1/1656 |
| 9,844,157 B1* | 12/2017 | Spencer | G06F 1/1656 |
| 9,975,174 B2* | 5/2018 | Yeates | B22D 19/04 |
| 9,990,000 B2* | 6/2018 | Perko | G06F 1/1637 |
| 10,094,165 B2* | 10/2018 | Oleh | E02D 29/1454 |
| 10,154,327 B2* | 12/2018 | Auclair | G10K 11/18 |
| 10,159,320 B2* | 12/2018 | Armstrong | H04B 1/3888 |
| 10,238,012 B2* | 3/2019 | Wakana | H05K 7/20854 |
| 10,528,086 B2* | 1/2020 | Chung | H05K 1/028 |
| 10,542,628 B2* | 1/2020 | Prest | H05K 5/0017 |
| 10,612,660 B2* | 4/2020 | Yanagi | F16J 15/3236 |
| 2002/0079653 A1* | 6/2002 | Noguchi | H05K 5/061 277/628 |
| 2004/0188120 A1* | 9/2004 | Komatsu | H05K 5/061 174/17 CT |
| 2006/0131819 A1* | 6/2006 | Kurano | F16J 15/0806 277/628 |
| 2008/0066956 A1* | 3/2008 | Lawlyes | H05K 5/062 174/535 |
| 2008/0170357 A1* | 7/2008 | Hsu | G02F 1/133308 361/724 |
| 2009/0014965 A1* | 1/2009 | Kudo | F16J 15/102 277/591 |
| 2009/0175020 A1* | 7/2009 | Zadesky | G06F 1/1626 361/818 |
| 2009/0296357 A1* | 12/2009 | Pitkonen | H04M 1/18 361/752 |
| 2010/0206601 A1* | 8/2010 | Choraku | H04M 1/0249 174/50.5 |
| 2010/0214732 A1* | 8/2010 | Charles | H05K 5/061 361/679.33 |
| 2011/0032690 A1* | 2/2011 | Han | H05K 9/0096 361/818 |
| 2011/0188178 A1* | 8/2011 | Myers | G06F 1/1698 361/679.01 |
| 2013/0146323 A1* | 6/2013 | Yamaguchi | F16J 15/062 174/50 |
| 2013/0157724 A1* | 6/2013 | Kim | H04M 1/0247 455/566 |
| 2014/0016217 A1 | 1/2014 | Rayner | |
| 2014/0078677 A1* | 3/2014 | Dolci | H01L 23/40 361/719 |
| 2014/0085839 A1 | 3/2014 | Nakano et al. | |
| 2014/0135081 A1* | 5/2014 | Lin | H04B 1/3888 455/575.8 |
| 2015/0063618 A1* | 3/2015 | Chen | H04R 1/025 381/332 |
| 2016/0212526 A1* | 7/2016 | Salvatti | H04R 1/026 |
| 2016/0254587 A1* | 9/2016 | Jung | H02J 50/12 343/702 |
| 2017/0082509 A1 | 3/2017 | Bushnell et al. | |
| 2017/0340078 A1 | 11/2017 | Huang | |
| 2018/0278288 A1* | 9/2018 | Yamaguchi | G06F 1/1637 |

FOREIGN PATENT DOCUMENTS

| | | |
|---|---|---|
| CN | 106159545 | 11/2016 |
| CN | 106852054 | 6/2017 |
| CN | 109076115 | 12/2018 |
| CN | 209299149 | 8/2019 |
| KR | 20030089459 | 11/2003 |

* cited by examiner

ROTATING FRAME LOCK FOR FRONT CRYSTAL RETENTION AND SEALING

CROSS-REFERENCE TO RELATED APPLICATION

This application claims the benefit of and priority to U.S. Provisional Application No. 62/906,550, filed on Sep. 26, 2019, and titled "ROTATING FRAME LOCK FOR FRONT CRYSTAL RETENTION AND SEALING," the content of which is herein incorporated by reference in its entirety for all purposes.

FIELD

The described embodiments relate generally to coupling of electronic device housing components and more particularly to structures for joining housing components.

BACKGROUND OF THE INVENTION

Electronic device housings often contain multiple components that are joined together to surround electronic components. For example, two or more housing components can be joined to form an outer or exterior surface surrounding an interior cavity or volume in which electronic components are housed. Adhesives can be used to join the housing components together. The adhesives can be susceptible to moisture, chemicals and debris and can breakdown over time. The breakdown of the adhesives can allow small gaps to form between the housing components, allowing foreign debris and moisture to enter the housing. The moisture and debris can cause the electronic components to stop functioning.

BRIEF SUMMARY OF THE INVENTION

This disclosure relates to various embodiments that relate to housing components for use with an electronic device. The housing can include a first housing component with a first engagement surface, a second housing component with a second engagement surface facing the first engagement surface, and a connector forming a joint between the first and second interface surfaces. The connector can include restraining features for joining the first housing component and the second housing component. The joint between the first housing component and the second housing component can form a watertight seal.

In some embodiments an electronic device includes a housing surrounding and protecting electronic components. The housing can include multiple components joined by one or more connectors. A connector can include a first face for engaging with a first housing component and a second face for engaging with a second component. The joint component can engage with the first component and rotate to engage with the second component joining the first and second components. The joint component can form a sealed joint between the first and second components to protect the electronic components from moisture and debris.

A housing for an electronic device is disclosed and includes the following: a first housing component having a first engagement surface disposed around its periphery; a second housing component defining an interior volume and having a second engagement surface disposed around a periphery of the interior volume and aligned with the first engagement surface; and a connector having a body formed in a loop disposed between the first and second engagement surfaces, the body having a first face configured to engage with the first engagement surface of the first housing component and a second face, generally opposite the first face, configured to engage with the second engagement surface of the second housing component, wherein the connector is operable to, in response to a force compressing the first and second housing components together, seal the first housing component to the second housing component to enclose the cavity.

An electronic device is disclosed and includes the following: a housing comprising: an opaque cover having a first engagement surface disposed around its periphery; a second housing component having a recessed region and a second engagement surface disposed around a periphery of the recessed region and aligned with the first engagement surface; and a connector having a body formed in a loop disposed between the first and second engagement surfaces, the body having a first face configured to engage with the first engagement surface of the opaque cover and a second face, generally opposite the first face, configured to engage with the second engagement surface of the second housing component, wherein the connector is operable to, in response to a force compressing the opaque cover and second housing components together, seal the opaque cover to the second housing component forming an enclosed cavity between the opaque cover and second housing component that includes the recessed region; and a display coupled to the opaque cover within the enclosed cavity.

Another housing for an electronic device is disclosed and includes the following: a first housing component having a first engagement surface disposed around its periphery; a second housing component defining an interior volume and having a second engagement surface disposed around a periphery of the interior volume and aligned with the first engagement surface; and a connector having a body formed in a loop disposed between the first and second engagement surfaces and rotatable from an unengaged position in which the first and second housing components are not sealed together to an engaged position in which the connector seals the first housing component to the second housing component, the body having upper and lower members joined by a neck, a first face spaced apart from the first engagement surface of the first housing component and a second face, generally opposite the first face, and spaced apart from the second engagement surface of the second housing component, wherein each of the first and second faces extend along portions of the upper member, the neck and the lower member, and wherein a width of each of the upper and lower members between the first and second faces is greater than a distance between the first and second engagement surfaces when the connector is in the engaged position sealing the first housing component to the second housing component.

To better understand the nature and advantages of the present invention, reference should be made to the following description and the accompanying figures. It is to be understood, however, that each of the figures is provided for the purpose of illustration only and is not intended as a definition of the limits of the scope of the present invention. Also, as a general rule, and unless it is evident to the contrary from the description, where elements in different figures use identical reference numbers, the elements are generally either identical or at least similar in function or purpose.

DETAILED DESCRIPTION OF THE INVENTION

Electronic devices can include a device housing surrounding electronic components. The device housing can include multiple components joined together. For example, the housing can include a component that forms a back of the housing, one or more components that form sidewalls of the housing, and a component that forms the front of the housing. The housing components can be joined together using adhesives or a polymer positioned in a joint between the components. The electronic devices and the device housing are often subjected to liquid and debris that, if allowed to enter the device housing, can damage the electronic components inside. The adhesives and polymers used to join the housing components can breakdown, allowing moisture and debris to reach the electronic components.

Some embodiments of the invention provide a solution for joining housing components to form a watertight joint that prevents moisture and debris from reaching the electronic components in the electronic device. The watertight joint can be formed using a connector positioned between a first and a second housing component. To connect the first and second housing components, the connector can be positioned with a first side of the connector engaging the first housing component. A force can be applied to the first housing component causing the connector to rotate until a second side of the connector engages with the second housing component. The connector can form a sealed joint between the first and second housing components that prevent or reduce moisture and debris from entering the joint.

These and other embodiments are discussed below with references to FIGS. 1-5; however, those skilled in the art will readily appreciate that the detailed description given herein with respect to these figures is for explanatory purposes only and should not be construed as limiting.

Figure 1A:
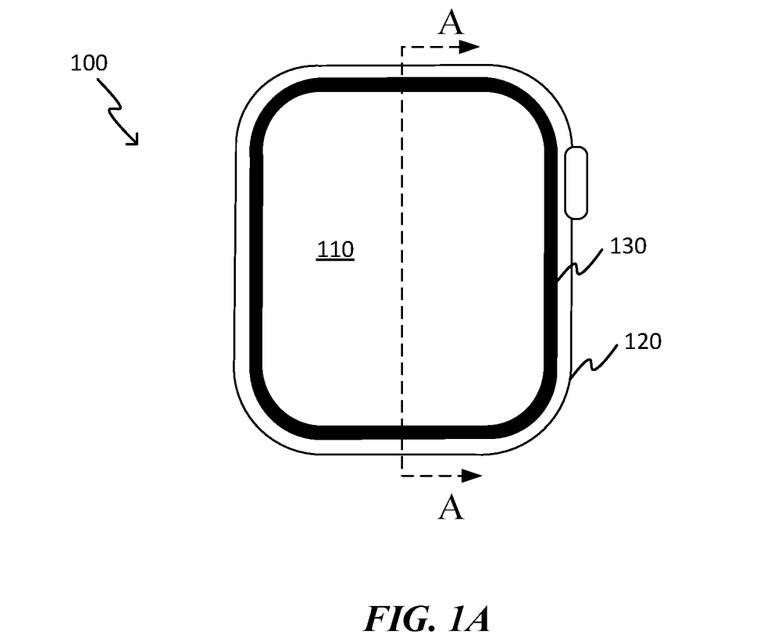
FIG. 1A is a simplified illustration of an electronic device including a housing according to some embodiments of the present invention.

FIG. 1A is a simplified illustration of an electronic device 100 according to some embodiments of the present invention. The electronic device 100 includes a housing formed by a front structure 110 connected to a body structure 120 by a connector 130. The electronic device can include electronic components (not shown) surrounded by the housing. The electronic device can be or include a wearable electronic device, for example a smartwatch, a phone, a tablet, a laptop, or other suitable devices.

The front structure 110 of the housing can be a relatively flat surface. In some embodiments, the front structure 110 can be a generally rectangular panel having four perimeter sides joined by rounded corners. The edges of front structure 110 can be molded or shaped along its periphery to engage with connector 130. For example, the edges can have a lip or notch for engaging with connector 130. The front structure 110 can overlay a display and/or touch sensitive surface (e.g., a touchscreen). In some embodiments, the front structure 110 can be or include glass, plastic, or other substantially transparent material. Further, the front structure 110 can be or include a port, a window, or a covering for an opening allowing access to the interior of the electronic device.

The front structure 110 can be sized and shaped to engage with an opening in the body structure 120. The body structure 120 can include sidewalls and a base portion defining an internal volume (e.g., a recessed region or cavity) for receiving the electronic components. The opening in the body structure 120 can include molded or shaped edges surrounding the opening for engaging with the connector 130. The body structure can be or include aluminum, titanium, amorphous metals, polymers, ceramics, glass, or other suitable materials.

The front structure 110 and the body structure 120 can be connected by connector 130 to form a sealed joint between the front structure 110 and the body structure 120. The connector 130 can include a body that has a first face that can be engaged with the front structure 110 and a second face that can be engaged with the body structure 120. In some embodiments, the body of connector 130 can form a loop (e.g., have a ring-like shape) that defines an opening that coincides generally with the opening formed in body structure 120. Thus, when connector 130 is positioned or disposed between the front structure 110 and the body structure 120 such that the body of connector 130 is aligned with the edges of front structure 110 and with the edges surrounding the opening of body structure 120, the opening defined by the body of connector 130 can be aligned with the opening of body structure 120.

In various embodiments, the connector 130 can be made of material that allows the connector 130 to be deformed and return to the original shape. For example, the connector 130 can be made entirely from, primarily from or include an elastomer that allows the connector or portions of the connector to be compressed and return to the uncompressed state. In some embodiments the connector 130 can be coupled with a switch and/or an electrical contact that can allow the connector 130 to cause a state change in the electronic device.

In some embodiments, the connector 130 can include restraining features. As discussed further in FIGS. 3A through 3D, the restraining features can engage with corresponding features on the front structure 110 or the body structure 120.

Figure 1B:
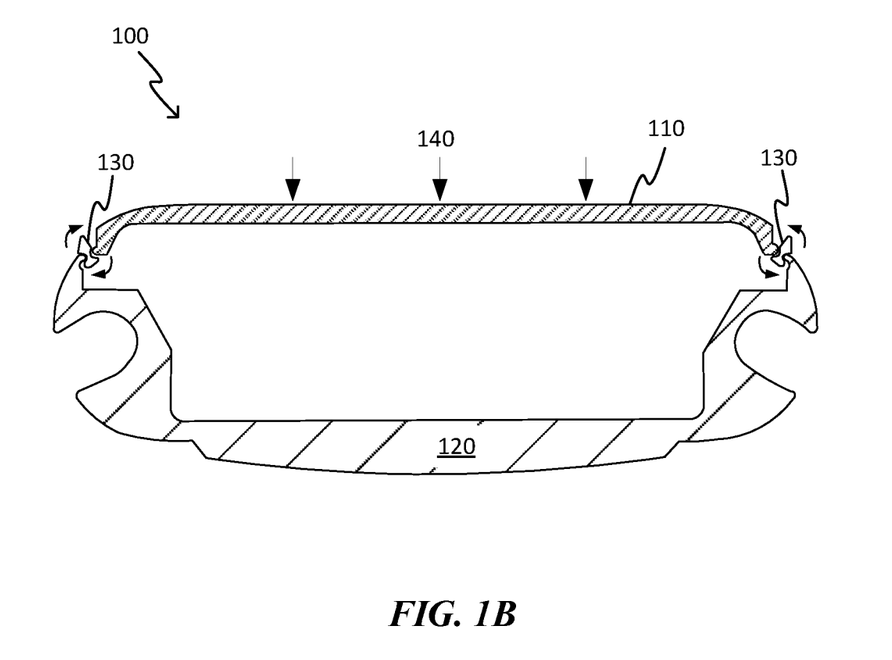
FIG. 1B is a simplified cross section of a housing of the electronic device of FIG. 1 viewed along line A-A in FIG. 1A according to some embodiments of the present invention.

FIG. 1B is a simplified cross section of the electronic device 100 of FIG. 1 viewed along line A-A before the front structure 110 has been seated. A force 140 can be applied to the front structure 110 to cause the connector 130 to rotate. The connector 130 can include a lower portion that contacts a portion of body structure 120 causing the connector to resist the force on the front structure 110 until a force peak has been reached. The force peak can be overcome by the force on the front structure 110 to rotate the connector 130 such that the lower portion of the connector 130 engages with a channel in the body structure 120. The connector 130 can engage with the front structure 110 and the body structure 120 to form a sealed joint. The sealed joint can prevent or reduce moisture and/or debris from entering the housing.

In some embodiments, the connector 130 is a ring that engages opposing edges of the front structure 110. For example, the front structure 110 can have a generally rectangular shape with rounded edges and the body structure 120 can have a similarly shaped generally rectangular opening for receiving the front structure 110. The connector 130 can engage with the opposing edges of the front structure 110 and corresponding edges of the body structure 120. In the first position, the connector 130 can support the front structure 110 and the front structure can be in an unseated position. In the unseated position the front structure 110 is not coupled to body structure 120 and is moveable by a force 140. The force 140 can be applied to the front structure 110 (or a force can be applied in an opposite direction to body structure 120) to compress the front and body structures together. Because of the shape of connector 130, such a force can cause the connector 130 to rotate along the perimeter of the front structure 110. The connector 130 can rotate until the connector 130 is engaged with both the body structure 120 and the front structure 110. In some embodiments, when the connector 130 rotates, it is plastically deformed by the front structure 110 and/or the body structure 120.

Figure 1C:
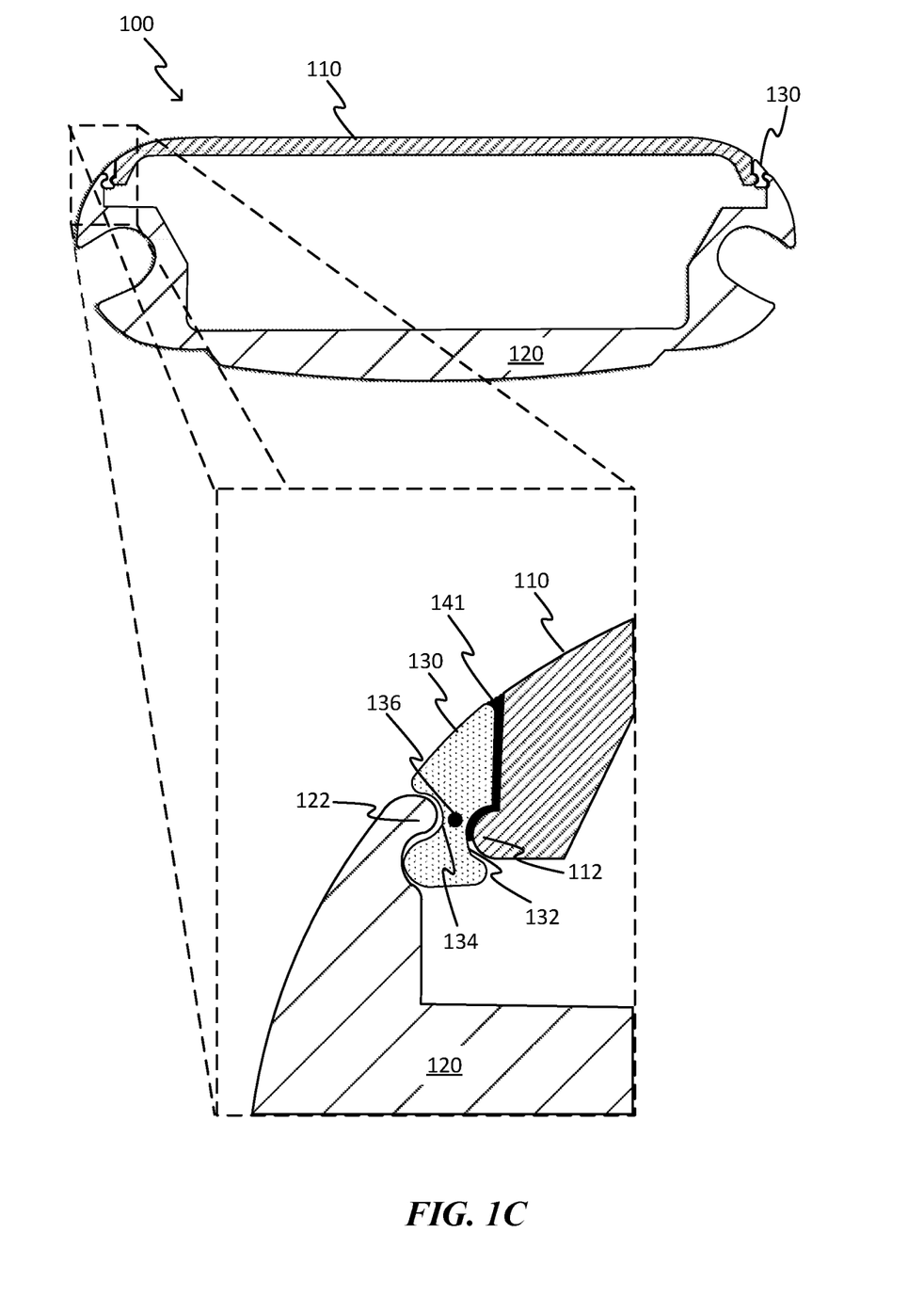
FIG. 1C is a simplified cross section of a portion the housing of FIG. 1B according to some embodiments of the present invention.

FIG. 1C is a simplified cross-section of a portion of the electronic device 100 of FIG. 1B after the front structure 110 is seated and the connector 130 has rotated to form a sealed joint between the front structure 110 and the body structure 120. The front structure 110 can be seated by the force 140 overcoming the force peak of the connector 130. Connector 130 can include first and second channels 132, 134 that are rounded or curved and can be axially offset from each other formed in first and second opposing faces, respectively, to facilitate the rotation of connector 130 in response to force 140. In the embodiment shown more clearly in the exploded view portion of FIG. 1C, connector 130 can further include an upper curved surface extending between the first and second faces, a first substantially flat portion extending between the upper curved surface and the first channel 132 and a second substantially flat portion extending between the first and second faces. Additionally, the second substantially flat portion can include rounded edges (e.g., lobes). These rounded edges can be positioned on each end of the second substantially flat portion (e.g., one lobe at the intersection of the second substantially flat portion and the first face and a second lobe at the intersection of the second substantially flat portion and the second face.

In some embodiments, the edge of the front structure 110, the body structure 120 or the connector 130 can include restraining features to form the watertight joint. For example, the front structure 110 can include a protrusion 112 that can engage with a first channel 132 in the first face of the connector 130 and the second face of the connector 130 can include a second channel 134 for engaging with a protrusion 122 on the edge of the body structure 120. The first channel 132 and the second channel 134 can be axially offset in a vertical direction to aid in the rotating of the connector 130. Further, to aid in the rotating of the connector 130, the connector 130 can be formed from a material that allows the connector, or portions of the connector, to deform during the seating of the front structure 110. As described further in reference to FIGS. 3A and 3B, the protrusions 312, 322 and channels 324 can be various shapes.

In some embodiments, the front structure 110 can be unseated. For example, a force can be applied to the interior surface of the front structure in a direction generally opposite that of force 140. The force can be applied to the interior surface of the front structure using an access port and/or a tool inserted into the cavity of the electronic device 100. The force can cause the front structure 110 to push against the connector 130. The connector 130 can rotate to free the front structure 110 and/or break in response. Further, the front structure 110 can be unseated with a tool connected to the front structure 110. For example, a suction-type tool can be attached to the outer surface of the front structure 110 to pull the front structure 110 away from the body structure 120.

In various embodiments, the first and/or second surface of the connector 130 can include a seal 141 around its periphery that can aid in preventing the intrusion of moisture, chemicals, and/or debris into the housing and can further adhere the connector 130 to one or both of front structure 110 and body structure 120. The seal can be positioned in the joint and compressed by the front structure 110, the connector 130, and/or the body structure 120 when the front structure 110 is seated in the body structure 120. In some embodiments, the seal 141 can be or include an adhesive, a polymer, an elastomer, a seal, a gasket, a rubber, a silicon, a Teflon, a heat sensitive material, or similar seal.

In some embodiments, the exterior surfaces of the front structure 110, the body structure 120, and the connector 130 can form a continuous exterior surface. For example, the connector 130 can be engaged with the front structure 110 and the body structure 120 to reduce gaps between the connector and the front structure 110 and/or the body structure 120. The exterior surface of the connector 130 can have the same surface finish/texture or be subject to the same finishing processes (e.g., grinding, machining, or polishing) to produce the continuous surface. Further, the exterior surface of front structure 110, the body structure 120, and the connector 130 can blend together. For example, the exterior surface of the connector 130 can have the same color as the front structure 110 and/or the body structure 120.

Figure 1D:
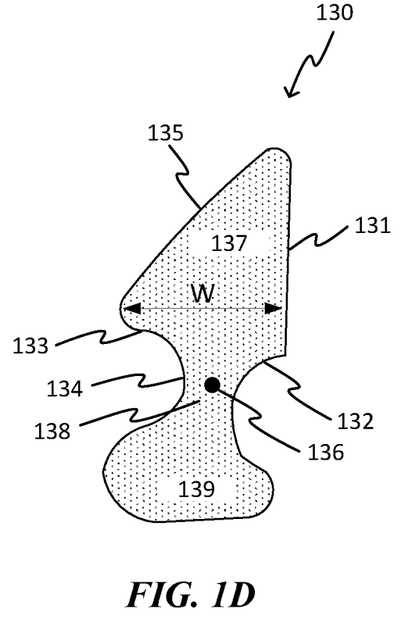
FIGS. 1D through 1G are simplified cross section views of connectors that can be incorporated into the electronic device of FIG. 1A according to some embodiments of the present invention.

Some embodiments of the invention pertain to a connector that can form a curved joint between the front structure 110 and the body structure 120. FIGS. 1D through 1G are cross sections of example connectors 130, 150, 160, and 170, respectively, that can be incorporated into the electronic device 100 of FIG. 1A. As shown in FIG. 1D, connector 130 can include a first face 131, a second face 133, an upper member 137, a neck 138, a lower portion 139, and an axis of rotation 136. Connector 130 can also include a slightly curved exterior surface 135 that extends between the first and second faces. The upper portion 137 and/or the lower portion 139 can be or include one or more members. The width of the upper portion 137 and/or the lower portion can be greater than the width of the neck 138. For example, the width of the upper portion 137 and the width of the lower portion 139 can be approximately the same and greater than the width of the neck 138 which extends between first and second channels 132 and 134. The difference in the width of the neck 138 and of the upper and lower portions 137 and 139 can allow the connector 130 to set the front structure 110 when the connector 130 rotates around the axis of rotation 136.

In some embodiments, the width of the upper and lower portions 137 and 139 would prevent the front structure 110 from being coupled to body structure 120 by connector 130 except for the fact that the connector can rotate under force as described herein. For example, when the connector 130 is positioned against the body structure 120 in the engaged position as shown in FIG. 1C (but with front structure 110 spaced apart from body structure 120 as opposed to engaged with the connector), the width (W) of the upper portion 137 can prevent the front structure 110 from being moved into the set position shown in FIG. 1C. The front structure 110 can have a diameter at its outer periphery (i.e., from protrusion 112 on one side to protrusion 112 on the opposing side) that is approximately the distance from a first channel 132 to an opposing second channel 134 of the connector 130. The diameter of the front structure 110 can be greater than the distance between the first face 131 at upper portion 137 at a first point of the connector 130 and the first face 131 at the upper portion 137 at an opposing point of the connector. The upper portions 137 having a separation smaller than the diameter of the front structure 110 can prevent the front structure 110 from traveling past the upper portion 137 to engage with the first channel 132. Rotating the connector 130, as described herein, can set the front structure 110 by allowing the distance between opposing upper portions 137 to be larger than the diameter of front structure 110 when the connector is in the open (unengaged) position shown in FIG. 1B, allowing the front structure 110 to be positioned in the first channel 132. In various embodiments, the protrusion 112 can rest on the lower portion 139 when engaged with the first channel 132. When the front portion is engaged with the first channel 132, the connector 130 can rotate to position the upper portion 137 above the edge of the front structure 110, forming a seal between the body structure 120 and the front structure 110.

Figure 1E:
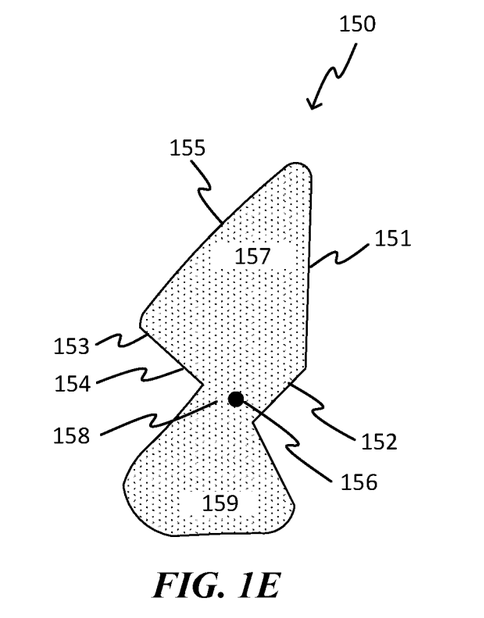
Figure 1F:
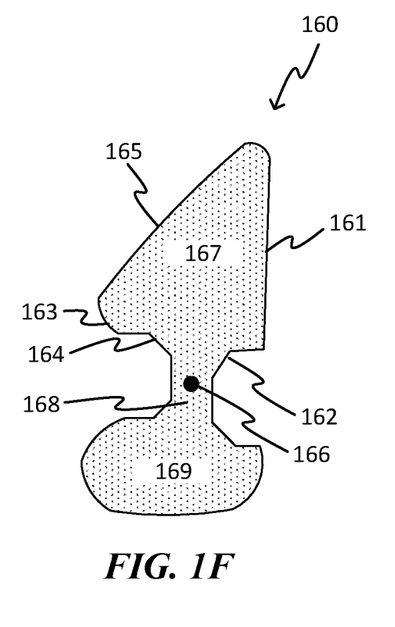
Figure 1G:
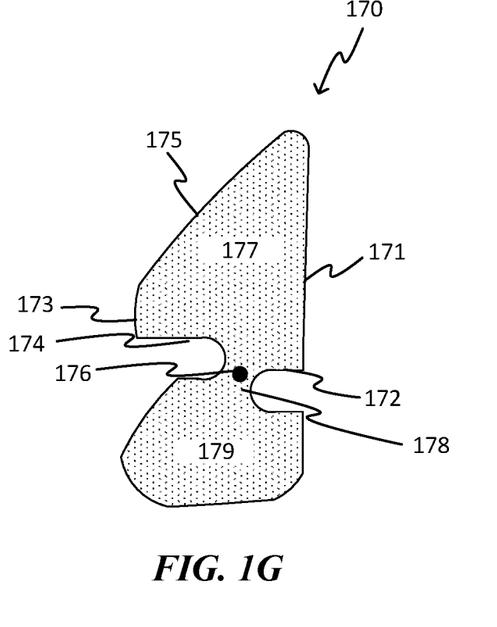

Connectors 150, 160, and 170 of FIGS. 1E, 1F, and 1G, respectively, can include some or all of the first face 151, 161, and 171; a second face 153, 163, and 173; the upper portion 157, 167, and 177; the neck 158, 168, and 178; the lower portion 159, 169, and 179; and the axis of rotation 156, 166, and 176. The connectors 150, 160, and 170 can also include a slightly curved exterior surface 155, 165, and 175, respectively, that extend between the first and second faces. The elements of connectors 150, 160, and 170 can be the same or similar to those described in reference to connector 130. Connectors 150, 160, and 170 can include shaped channels for engaging with protrusions 112 and 122. The channels can be sized and shaped to engage with protrusions 112 and 122 with corresponding shapes. Connector 150 includes notches 152 and 154 which are v-shaped notches. The notches 152 and 154 can engage with protrusions 112 and 122 and/or protrusions sized and shaped to engage with the notches 152 and 154. In some embodiments, the notches 152 and 154 can include material that allows them to deform to engage with the front structure 110 and/or the body structure 120. Connector 160 includes hexagonal shaped channels 162 and 164 and connector 170 includes thin channels 172 and 174. The hexagonal shaped channels 162 and 164 and the thin channels 172 and 174 can be the same or similar as first and second channels 132 and 134 and/or notches 152 and 154.

Figure 2A:
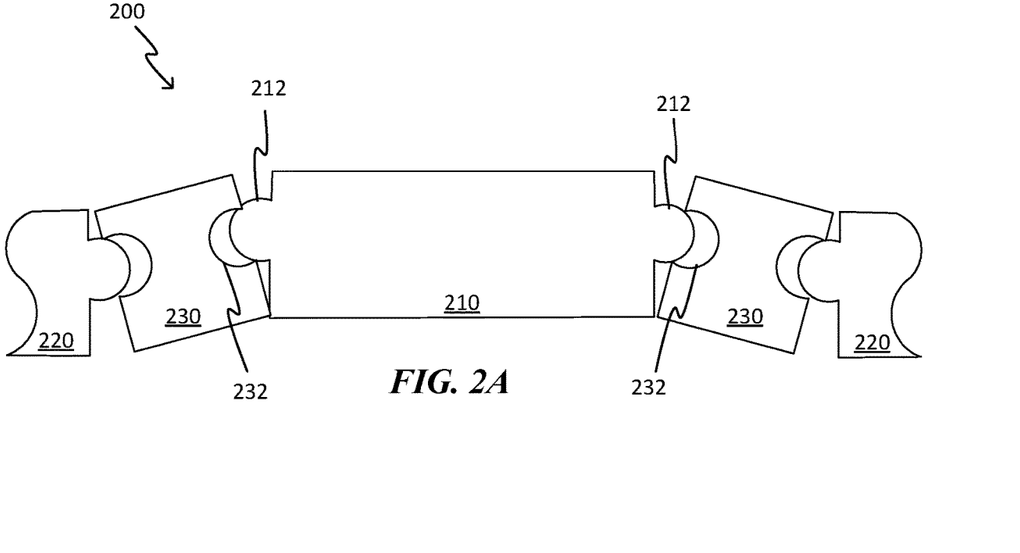
FIGS. 2A and 2B are cross-sections of an example of housing components and a connector for use with the electronic device of FIG. 1A according to some embodiments of the present invention.
Figure 2B:
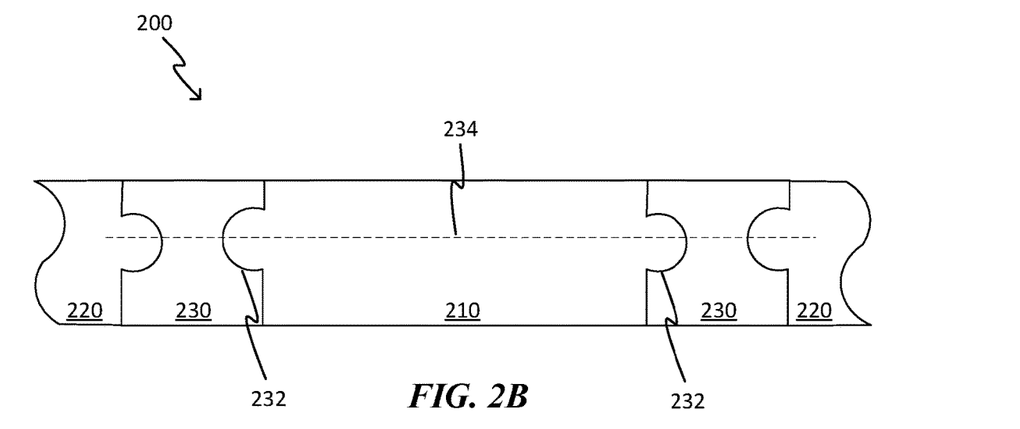

Some embodiments of the invention pertain to a connector, such as a ring connector, that can form a substantially flat joint between two structures that can be particularly useful where a port or other access point in housing can be included. FIGS. 2A and 2B are cross-sections of example of housing components 210 and 220, and a connector 230 for use with the electronic device 100 of FIG. 1A to form a flat joint 200. The flat joint 200 can include connector 230 for coupling a first housing component 210 to a housing body 220. For example, the connector 230 can be a ring shaped connector. However, the connector 230 may be any shape suitable for coupling the first housing component 210 and the housing body 220.

The connector 230 can rotate to form a bi-stable interlock mechanism. FIG. 2A shows the flat joint 200 with the first housing component 210 in the unset position. The connector 230 can be positioned between the first housing component 210 and the housing body 220. In some embodiments, the connector 230 can be rotated to accommodate protrusions 212 into channels 232.

A force can be applied to the first housing component 210 to set housing component 210 in place. FIG. 2B shows the flat joint 200 with the first housing component 210 in the set position. The connector 230 can rotate when the first housing component 210 moves from the set to the unset position. In some embodiments, the connector 230 can be or include material that can compress in response to the first housing component 210 moving from the unset to the set position. For example, the connector 230 can be in a relaxed state and engage with the first housing component 210 in the unset position. The connector 230 can compress and/or deform to accommodate the first housing component 210 moving from the unset to the set position. Further, the channels 232 can be or include material that can elastically deform to engage the protrusions 212 in the set position. For example, the channels 232 can widen to allow the protrusions 212 to move as the connector 230 rotates and the first housing component 210 moves from the unset to the set position.

The seated first housing component 210 can form flat joint 200. Flat joint 200 can include a substantially continuous surface between first housing component 210 and housing body 220. For example, the seams between the first housing component 210 and the connector 230, and between the connector 230 and the housing body 220 can lack gaps, grooves, or other surface discontinuities or irregularities, such that the exterior surface of the housing is a continuous and/or smooth surface. In some embodiments, the flat joint 200 can be used to install a port or other access point in the housing of the electronic device. For example, the first housing component 210 can be or include a radio frequency window or maintenance port. The connectors 230 can include restraining features for forming the flat joint 200. For example, the connectors 230 can include receiving channels 232 aligned along a central axis 234 for receiving restraining pieces on the first housing component 210 and the housing body 220.

Figure 3A:
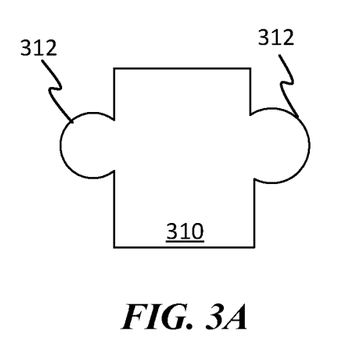
FIGS. 3A through 3C are cross-sections of example connectors for use with the electronic device of FIG. 1A according to some embodiments of the present invention.
Figure 3B:
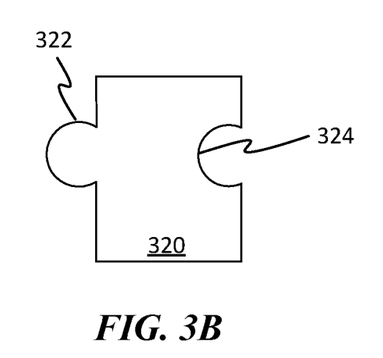
Figure 3C:
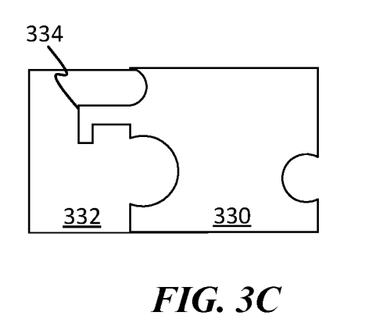

Connectors 130 and 230 can include various cross sections and/or restraining features. FIGS. 3A through 3C are cross sections of simplified connectors 310, 320, and 330 that can be incorporated into the electronic device 100 of FIG. 1A. The connectors 310 and 320 of FIGS. 3A and 3B, respectively, include restraining features with protrusions 312 and 322 that can be aligned with corresponding channels in housing components. For example, connector 310 shown in FIG. 3A includes two opposing protrusions 312 for engaging with corresponding channels in the housing components. The protrusions 312 can be or include material that is compressible to aid in the seating of the housing components. In some embodiments, the connector 310 can include one or more protrusions 312 and one or more channels 324. For example, the connector 300B of FIG. 3B can include a protrusion 322 and a channel 324 on an opposing side of the connector. The protrusion 322 can engage with a channel in the housing and the channel 324 can engage with a protrusion of the housing. Further, the protrusion 322 and/or the channel 324 can include a textured surface for aiding in the engagement between housing components and the connector 300.

In various embodiments, connector 130 can be shaped and/or include restraining features. For example, the connector 330 of FIG. 3C includes additional features to aid in the forming of a sealed joint. For example, a hook 334 (e.g., a feature with a shape similar to that of a hook) can be used to aid the retention and/or sealing abilities of the connector 330. The hook 334 can engage a similarly shaped channel in housing 332. The hook 334 can allow the connector 330 to lock in place. Further, the hook 334 can prevent the connector 330 from rotating when a force is applied to the internal side of the housing 332. In some embodiments, the hook 334 can act as a security feature for the electronic device 100. For example, the hook 334 can break in response to the housing 332 being unset. The broken hook 334 can prevent the housing 332 from being re-set using connector 330.

Figure 3D:
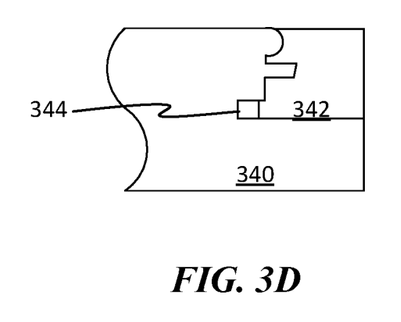
FIG. 3D is a cross-section of an example housing for use with the electronic device of FIG. 1A according to some embodiments of the present invention.

As shown in FIG. 3D, the housing of the electronic device can include features for engaging with the connector 340. For example, a notch or groove 344 can be part of the housing to allow a portion of the corresponding connector 342 to expand. For example, the notch can be slightly larger than the corresponding protrusion 312 on the connector, allowing the protrusion 312 to expand after the housing is set in place.

Figure 4A:
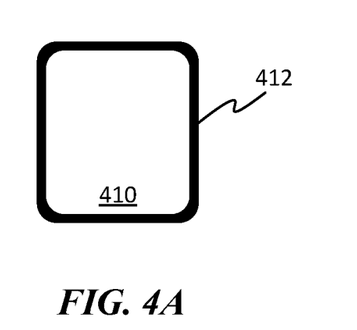
FIGS. 4A and 4B are top views of example housing and connectors for use with the electronic device of FIG. 1A according to some embodiments of the present invention.
Figure 4B:
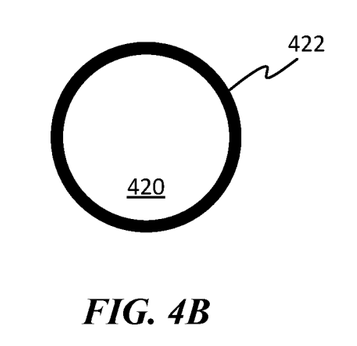
Figure 4C:
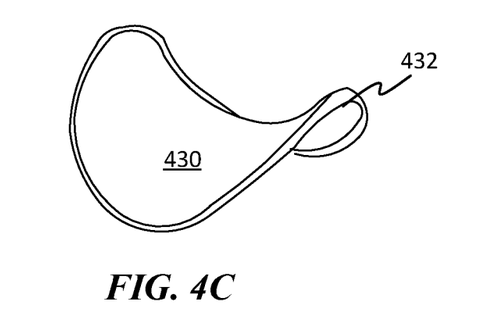
FIG. 4C is a perspective view of an example housing and connector for use with the electronic device of FIG. 1A according to some embodiments of the present invention.

In some embodiments the connectors can be formed into various shapes for connecting housing components. For example, FIGS. 4A and 4B are top views of example connectors 412 and 422, respectively, and FIG. 4C is a perspective view of an example connector 432. FIGS. 4A through 4C are only examples of possible connector shapes (e.g., a rectangle (4A) or a circle (4B)), the connector can be any suitable shape to form a sealed joint between housing components. The connectors 412, 422, and 432 can have a consistent cross section around the perimeter of housing components or different portions of the connectors 412, 422, and 432 can have different cross sections. For example, the connector 412 that engages with the straight edges of housing component 410 can have a first cross-section and the connector 412 that engages with the curved corners of housing component 410 can have a second cross-section. The connectors 412, 422, and 432 can be bi-stable, with a first position where the housing component 410, 420, and 430, respectively, are in an unset position. When the housing components 410, 420, and 430 are unset, the edges of the housing components 410, 420, and 430 can be engaged with connectors 412, 422, and 432, respectively. A force can be applied to the housing components 410, 420, and 430 causing the connectors 412, 422, and 432 to rotate. The connectors 412, 422, and 432 can rotate to a second position where the connectors can form a sealed joint between the housing components 410, 420, and 430, and the body of the electronic device housing.

In some embodiments, a connector can be used in conjunction with multi-plane housing 430. FIG. 4C is a multi-plane housing 430 with connector 432. The connector 432 can be engaged with the multi-plane housing 430 around the entire perimeter of the edge of the multi-plane housing 430. However, the connector 432 can be engaged with a portion of the edge of the multi-plane housing 430. The connector 432 can have a non-uniform cross-section to engage with the edges of the multi-plane housing 430. For example, the connector 432 can have a first cross-section for the edges of the multi-plane housing 430 that are in a high plane and a second cross-section for edges of the multi-plane housing 430 that are in a low plane. A force can be applied to one or more areas of the multi-plane housing 430 to seat the housing. In response to the force, the connector 432 can rotate and/or deform until the multi-plane housing 430 is in a set position and the connector 432 forms a joint between the multi-plane housing 430 and the body of the electronic device.

Figure 5:
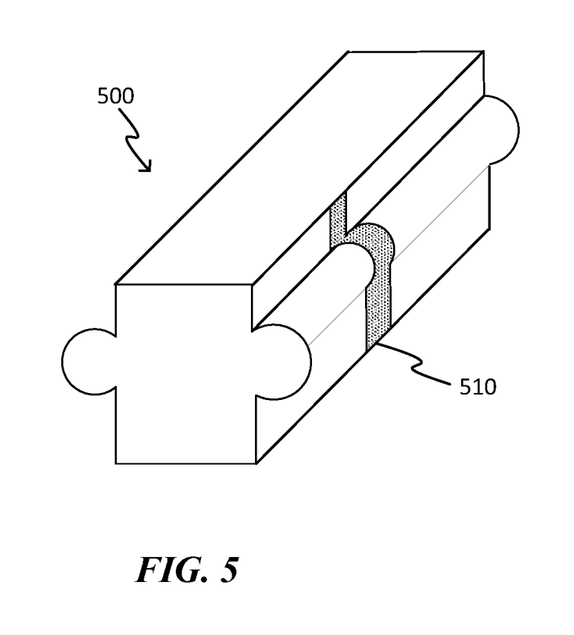
FIG. 5 is an example connector including a conductive trace for use with the electronic device of FIG. 1A according to some embodiments of the present invention.

In various embodiments the connector 300 can include features for connecting electronic components in the electronic device. FIG. 5 is a perspective cross-sectional view of a portion of a connector 500 that includes a conductive trace 510 for use with the electronic device 100 of FIG. 1A. The conductive trace 510 can connect electronic components within the housing of the electronic device 100. For example, the electronic component can provide an electrical connection between a sensor on the external surface of the electronic device and the power source of the electronic device. The conductive trace 510 can be on the exterior of the connector 300 or can be internal to the connector 300. The conductive trace 510 can electrically couple electronic components. Further, the conductive trace 510 can be or include an antenna, copper, silver, or any suitable conductive material.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

What is claimed is:

1. A housing for an electronic device, the housing comprising:
   a first housing component having a first engagement surface disposed around its periphery;
   a second housing component defining an interior volume and having a second engagement surface disposed around a periphery of the interior volume and aligned with the first engagement surface; and
   a connector having a body formed in a loop disposed between the first and second engagement surfaces, the body having an upper member and a lower member joined by a neck, a first face extending along portions of the upper member, the neck, and the lower member and being configured to engage with the first engagement surface of the first housing component and a second face, generally opposite the first face, and extending along portions of the upper member, the neck, and the lower member, the second face being configured to engage with the second engagement surface of the second housing component, wherein the connector is operable to, in response to a force compressing the first and second housing components together, seal the first housing component to the second housing component to enclose the interior volume.

2. The housing of claim 1, wherein the first engagement surface includes a first protrusion and the second engagement surface includes a second protrusion and wherein the first face of the connector includes a first channel aligned with the first protrusion and the second face of the connector includes a second channel aligned with the second protrusion.

3. The housing of claim 2, wherein the first and second channels are vertically offset from each other enabling the connector to rotate in response to the force along an axis extending within the body between the first and second channels.

4. The housing of claim 3, wherein the first and second channels extend fully around inner and outer peripheries of the body, respectfully, and wherein the axis extends throughout an entirety of the loop of the body.

5. The housing of claim 1, wherein the connector retains a cross-sectional shape when the connector seals the first housing component to the second housing component to enclose the interior volume.

6. The housing of claim 1, wherein the connector comprises an electrical trace on an exterior surface of the connector, the electrical trace connecting electrical components.

7. The housing of claim 1, wherein the first housing component comprises an opaque material allowing light and touch input to travel through the first housing component.

8. The housing of claim 1, wherein the first face includes a first channel sized and shaped to engage with a first protrusion on the first engagement surface and the second face includes a second channel sized and shaped to engage with a second protrusion on the second engagement surface, wherein a center axis of the first channel and a center axis of the second channel are offset along a vertical direction.

9. An electronic device, comprising:
   a first housing component comprising:
      an opaque cover having a first engagement surface disposed around its periphery;
      a second housing component having a recessed region and a second engagement surface disposed around a periphery of the recessed region and aligned with the first engagement surface; and
   a connector having a body formed in a loop disposed between the first and second engagement surfaces, the body having an upper member and a lower member joined by a neck, a first face extending along portions of the upper member, the neck, and the lower member and being configured to engage with the first engagement surface of the opaque cover and a second face, generally opposite the first face, and extend along portions of the upper member, the neck, and the lower member, the second face being configured to engage with the second engagement surface of the second housing component, wherein the connector is operable to, in response to a force compressing the opaque cover and second housing components together, seal the opaque cover to the second housing component forming an enclosed cavity between the opaque cover and second housing component that includes the recessed region; and
   a display coupled to the opaque cover within the enclosed cavity.

10. The electronic device of claim 9, wherein the connector includes a body formed in a loop and having a first face configured to engage with the first engagement surface of the opaque cover and a second face, generally opposite the first face configured to engage with the second engagement surface of the second housing component.

11. The electronic device of claim 10, wherein the first engagement surface includes a first protrusion and the second engagement surface includes a second protrusion and wherein the first face of the connector includes a first channel aligned with the first protrusion and the second face of the connector includes a second channel aligned with the second protrusion where the first and second channels are axially offset from each other and the connector is configured to rotate in response to the force compressing the opaque cover and the second housing component together.

12. The electronic device of claim 9, wherein the connector comprises an electronic trace for connecting electronic components disposed within the first housing component of the electronic device.

13. The electronic device of claim 9, wherein the connector comprises one or more restraining features and at least one of the opaque cover or second housing component engages the one or more restraining features to form a watertight joint.

14. The electronic device of claim 9, further comprising a compressible seal disposed adjacent to the connector in a watertight joint.

15. A housing for an electronic device, the housing comprising:
   a first housing component having a first engagement surface disposed around its periphery;
   a second housing component defining an interior volume and having a second engagement surface disposed around a periphery of the interior volume and aligned with the first engagement surface; and
   a connector having a body formed in a loop disposed between the first and second engagement surfaces and rotatable from an unengaged position in which the first and second housing components are not sealed together to an engaged position in which the connector seals the first housing component to the second housing component, the body having an upper member and a lower member joined by a neck and a first face spaced apart from a second face, wherein each of the first and second faces extend along portions of the upper member, the neck, and the lower member, and wherein the upper and lower members are configured to contract when the connector is in the engaged position.

16. The housing for an electronic device of claim 15, wherein the connector further comprises a curved surface extending along an exterior of the upper member between the first face and the second face and the first face further includes a first substantially flat portion extending along the upper member between the neck and the curved surface, the first substantially flat portion engaging a portion of the first housing component when the connector is in the engaged position.

17. The housing for an electronic device of claim 16, wherein the connector further comprises a second substantially flat portion extending along an exterior surface of the lower member between the first face and second face, the second substantially flat portion positioned within the interior volume when the connector is in the engaged position.

18. The housing for an electronic device of claim 15, wherein the connector comprises an elastomer material.

19. The housing for an electronic device of claim 15, wherein the body forms a generally rectangular loop having rounded corners.

20. The housing for an electronic device of claim 15, wherein the neck is defined by first and second channels extend fully around inner and outer peripheries of the body of the connector, respectfully, and are vertically offset from each other enabling the connector to rotate along an axis extending within the body between the first and second channels in response to a force compressing the first and second housing components together.

* * * * *